United States Patent [19]

Ricaud et al.

[11] 4,386,280

[45] May 31, 1983

[54] REMOVABLE CONTACTLESS TRANSMISSION CLAMP ASSEMBLY SYSTEM

[75] Inventors: Jean-Louis Ricaud, Bourg La Reine; Pierre R. Briez, Fontenay le Fleury; Pierre Sajot, Beynes, all of France

[73] Assignee: Commissariat a l'Energie Atomique, Paris, France

[21] Appl. No.: 145,753

[22] Filed: May 1, 1980

[30] Foreign Application Priority Data

May 7, 1979 [FR] France ................................. 7911469

[51] Int. Cl.³ ............................................ H01F 23/00
[52] U.S. Cl. ..................................... 307/145; 336/176
[58] Field of Search ..................... 307/145, 149, 151; 336/173, 174, 176, 182, 183

[56] References Cited

U.S. PATENT DOCUMENTS

| | | | |
|---|---|---|---|
| 2,413,195 | 12/1946 | Schwager | 336/196 X |
| 2,476,121 | 7/1949 | Smith, Jr. | 336/176 X |
| 3,667,342 | 6/1972 | Warnock et al. | 89/1.50 |
| 3,742,408 | 6/1973 | Jaeger | 336/5 |
| 3,793,166 | 2/1974 | Shaw | 204/108 |

FOREIGN PATENT DOCUMENTS

| | | |
|---|---|---|
| 2429049 | 1/1976 | Fed. Rep. of Germany . |
| 2543828 | 4/1977 | Fed. Rep. of Germany . |
| 671744 | 12/1929 | France . |
| 952243 | 11/1949 | France . |
| 1303365 | 7/1962 | France . |
| 497075 | 12/1938 | United Kingdom . |
| 1099866 | 1/1968 | United Kingdom . |
| 1199256 | 7/1970 | United Kingdom . |

Primary Examiner—G. Z. Rubinson
Assistant Examiner—James L. Dwyer
Attorney, Agent, or Firm—Michael N. Meller; Anthony H. Handal

[57] ABSTRACT

A method and apparatus for electrical transmission, wherein an electric current is applied to the primary winding of a mains transformer the secondary winding of which consists of at least one spiral, and a corresponding electric current is collected at the secondary winding of at least one distribution transformer, the primary winding of which consists of said spiral, while the secondary winding of the distribution transformer is mounted in a removable member.

10 Claims, 5 Drawing Figures

REMOVABLE CONTACTLESS TRANSMISSION CLAMP ASSEMBLY SYSTEM

BACKGROUND OF THE INVENTION

The invention relates to a method and apparatus for electrical transmission using a removable connecting system without contact.

In a number of applications, it is desirable to be able to use removable connecting systems with no risk of setting up an electric current by manual contact. It is also desirable to have connecting systems the connecting-up of which does not give rise to any electric arcs, particularly when these systems are used in an ignitable medium or in mines.

Moreover, in certain particular applications, notably in the presence of dangerous products, these products have to be placed inside a sealed seal or behind an impervious wall and handled by remote control through the walls. During these various manoeuvres, a certain number of devices or pieces of equipment located behind the wall or inside the cell are electrically controlled, and the results of measurements made on these products have to be communicated to reading or recording equipment located on the outside. The transmission of the electrical energy available outside the cell to equipment inside the cell, and the communication of information from inside the cell, such as the results of measurements made on the inside, present different problems. These are primarily problems of ensuring that the electric wires or cables generally used pass through the walls in sealed manner. Problems also arise in the connection, by remote control, of the apparatus used inside the cell to conventional power points using manipulators. Finally, there is the problem of the corrosion of parts of cables or wires and power points located inside the cell when the products being handled are particularly aggressive.

BRIEF SUMMARY OF THE INVENTION

This invention relates to a method and apparatus for electrical transmission which does not have the disadvantages of the known devices, i.e. there is no risk of setting up an electric current when it is disconnected, and there is no risk of any electric arc being produced at the connector. Moreover, when used for handling dangerous products, it ensures that it can be passed through the walls of the cell in a perfectly leaktight manner, it permits particularly simple remote-controlled connected of the apparatus contained in the cell, and it comprises portions to pass through the wall which are not liable to corrosion. Finally, this apparatus is particularly simple and reliable and, in a number of embodiments, any worn parts can be removed without breaking the seal.

To this end, a method of electrical transmission according to the invention is characterised in that it consists in applying an electric current to the primary winding of a mains transformer, the secondary winding of which consists of at least one spiral, and collecting a corresponding electric current at the secondary winding of at least one distribution transformer the primary winding of which is formed by said spiral, whilst the secondary winding of the distribution transformer is located in a removable member constituting the movable part of the connecting system.

In a particular embodiment of the invention, the electric current applied to the primary winding of the mains transformer comprises a power current on which is superimposed a modulated current for transmitting coded information.

The mains and distribution transformers are preferably located on each side of a wall, whilst the spiral common to these transformers passes through this wall.

The invention also relates to an apparatus for electric transmission comprising a mains transformer and at least one distribution transformer, these transformers having a common winding consisting of at least one spiral which defines the secondary winding of the mains transformer and the primary winding of the distribution transformer, the secondary winding of the latter being arranged in a removable member.

According to another feature of the invention, the removable member is a clamp comprising a handle which can be gripped by an apparatus for remote-controlled manipulation.

According to yet another feature of the invention, the removable member is a clamp which carries roller bearings capable of rolling on cam surfaces suitable for controlling the opening and closing of the clamp when the latter is moved in a specific direction. According to a first variant, the roller bearings are then mounted at the ends of the jaws of the clamp, whilst the cam surfaces are formed by the outer surfaces of the spiral or a sheath surrounding the spiral. According to a second variant, the roller bearings are mounted on travelling blocks integral with the jaws of the removable clamp, whilst the cam surfaces are formed on a detachable member.

According to another feature of the invention, the removable member is associated with a member movable in translation in a direction parallel to the axis of the spiral and/or movably in rotation about this axis. A structure of this kind can be used, in particular, for controlling the movements of a carriage, a drop-shut door or a door.

According to a further feature of the invention, when the apparatus is intended to transmit a three-phase electric current, it comprises three spirals for transmitting the three phases of the electric currents. This particular structure makes it possible to transmit the electrical energy required for operating an apparatus supplied with three-phase current.

When the apparatus according to the invention is intended to transmit an electric current through a wall, the mains transformer is located on a first side of the wall and the distribution transformer is located on the other side of the wall, whilst the spiral common to these transformers passes through the wall.

According to a first variant, the spiral is fixed to the wall in sealed manner at the points where it passes through. Attachment may be effected by welding the spiral on to the wall, and particularly on to the stainless steel plating which generally defines the inner surface of the wall.

According to a second variant, the part of the spiral located on the other side of the wall is accommodated in a sheath fixed to the wall in sealed manner. As in the first variant, the leaktight seal is preferably effected by welding the sheath to the wall, notably to the armour plating defining the inner surface thereof. The sheath thus constitutes a tubular excrescence of the wall, which is connected thereto at both ends, so that the inside of the excresence communicates with the first side of the wall, and the spiral common to the transformers is arranged on the first side of the wall and inside the tubular excrescence.

BRIEF DESCRIPTION OF THE DRAWINGS

A particular embodiment of the invention will now be described, as a non-restrictive example, referring to the accompanying drawings, wherein.

DETAILED DESCRIPTION OF THE PREFERRED EMBODIMENTS

Figure 1:
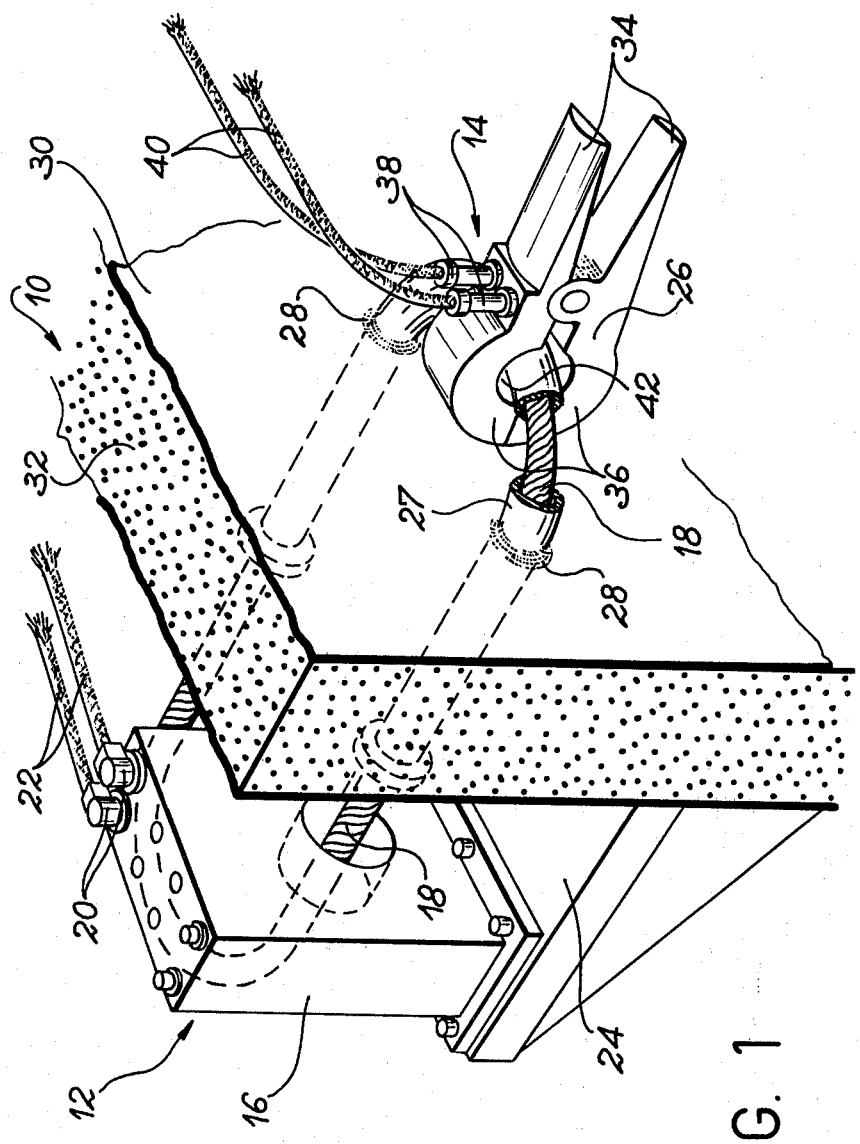
FIG. 1 is a perspective view of an apparatus for transmitting electric currents through a sealed wall.

FIG. 1 shows an exploded view of a wall 10, such as one of the walls of a cell intended to contain dangerous products such as explosives, for example. Various pieces of equipment (not shown) for manipulating these products, detecting certain phenomena and effecting measurements of all kinds are also located inside the cell. These pieces of equipment may be, for example, jacks, carriages, doors, relays and measuring and monitoring equipment of all kinds. They are generally controlled by means of electrical energy coming from outside the cell, and the measuring and monitoring apparatus have to transmit certain information to reading or recording equipment located outside the cell. Some of these apparatus also have to receive control signals emitted from outside the cell. Moreover, owing to the atmosphere prevailing inside the cell, it is not possible to enter the cell, which means that all the manoeuvres have to be carried out by remote control, for example using manipulators which also pass through the walls of the cell. In particular, the electrical connections of the different apparatus located inside the cell are established by remote control in this way.

According to the invention, transmission of the various electrical signals formed by the energy supplying the apparatus and the information provided, in particular, by the measuring and control equipment through the wall 10 is effected by means of an apparatus comprising a mains transformer 12 arranged outside the cell and a distribution transformer 14 arranged inside the cell. The transformers 12 and 14 may be either current transformers or voltage transformers, depending on the operating point chosen on the load characteristics of the apparatus. The primary winding and the core of the transformer 12 are arranged in a housing 16 and the secondary winding 18 of this transformer consists of a single spiral, preferably made from a bar, a tube or twisted copper wires. The primary winding of the transformer 12 is supplied by a current source (not shown) electrically connected to the outputs 20 of this winding by means of wires 22. As will be seen hereinafter, the outlets 20 may simultaneously be connected to measuring, reading or recording apparatus (not shown). The housing 16 containing the primary winding and the core of the transformer 12 is carried by a support plate 24 which may be fixed to the wall 10 of the cell.

According to the invention, the single spiral 18 which constitutes the secondary winding of the transformer 12 passes through the wall 10 in leaktight manner so as to form the primary winding of the transformer 14. The secondary winding and the core of the transformer 14 are located inside a removable member such as a clamp 26 arranged so as to be mounted and demounted by remote control using a conventional manipulator. The clamp 26 is an ammeter clamp, the principle of which is well known in the art.

In the embodiment shown in FIG. 1, the part of the copper spiral 19 situated inside the cell is accommodated in a sheath 27 fixed in leaktight manner by welds 28 on to the inner armour plating 30 of the wall 10, the main part 32 of which consists of a layer of lead. The sheath 27 thus constitutes a tubular excrescence of the wall 10 into the cell. This structure results in a perfect seal between the inside and outside of the cell bounded by the wall 10. Moreover, as is clearly shown in FIG. 1, the sheath 27 constitutes an excrescence of the wall 10, and, more precisely, of the inner armour plating 30 thereof, inside the cell, so that the spiral 18 does not actually penetrate into the cell even though it passes through the wall 10 thereof. This feature, which is essential when the apparatus according to the invention is to be used for transmitting electric current through the wall of a cell in which dangerous products are handled, enables this current to be transmitted without there being any discontinuity in the wall. In particular, this means that it is not necessary to use any joint or any other component subject to wear which cannot be dismantled at the point where the spiral passes through the wall. As a result, all the components of the connecting system which are subject to wear, including the spiral 18, can easily be removed without breaking the seal of the cell.

Preferably, the sheath 27 and the inner armour plating 30 of the wall 10 are made of stainless steel, thus making it possible to limit the losses caused by Foucault currents. Moreover, the spiral 18 may be covered with insulating material, if desired.

Figure 2:
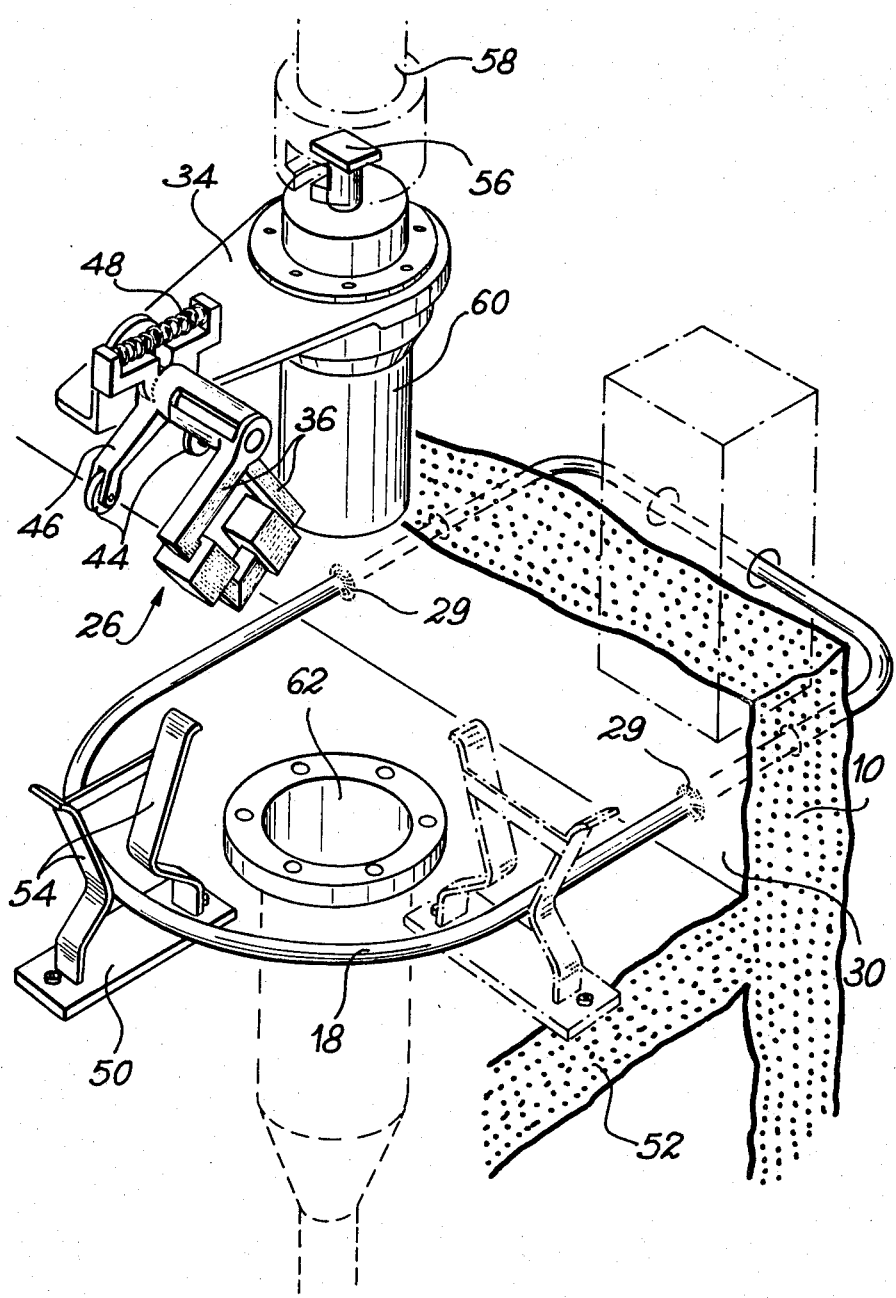
FIG. 2 is a perspective view showing an alternative embodiment of the apparatus in FIG. 1, and especially the clamp in which the secondary winding of the distribution transformer is housed.

In another embodiment shown in FIG. 2, the copper spiral 18 is fixed in leaktight manner to the wall 10 at the points where it passes through, by means of welds 29 effected directly between the spiral 18 and the inner armour plating 30 of the wall 10. As in the preceding embodiment, there is thus a perfect seal between the inside and outside of the cell. This armour plating 30 constitutes a shunt for the spiral 18. However, given that the resistivity of the armour plating is much greater than that of the spiral, the shunt diverts only a small part of the current.

The clamp 26 comprises a handle 34 the shape of which is designed so that it can be gripped by remote control by a manipulator, and two jaws 36 in which the secondary winding and the core of the transformer 14 are accommodated. The clamp 26 also comprises two outlets 38 by which the secondary winding of the transformer is electrically connected, by means of wires 40, to at least one of the instruments provided inside the cell. When the clamp 26 is closed as shown in FIG. 1, the ends of the jaws 36 make contact with each other and the magnetic flux generated in the core of the transformer 14 is closed when the spiral 18 is located in an annular space 42 defined between the jaws 36.

As shown in FIG. 1, the spiral 18 may be housed with relatively great play in the space 42, thus facilitating the remote-controlled assembly of the clamp 26. To make the assembly and dismantling of the clamp even easier, in an alternative embodiment of the clamp 26 shown in FIG. 2 roller bearings 44 are rotatably mounted on travelling blocks 46 integral with the jaws 36 of the clamp, the latter being urged into the closed position by a spring 48. Moreover, a member 50 fixed to another wall 52 of the cell defines two opposing cam surfaces 54 which are symmetrical along a plane passing through the axis of the spiral 18, on which surfaces the roller bearings 44 roll when the clamp is moved perpendicularly to the plane defined by the spiral and contained in the plane of symmetry of the cam surfaces. The cam surfaces 54 are designed and arranged so that the clamp 26 opens when it comes level with the spiral 18, then closes around said spiral.

In the alternative embodiment shown in FIG. 2, the handle 34 of the clamp 26 has a dovetail 56 capable of being received in a corresponding groove formed at the end of a manipulator arm 58 shown by dash-dot lines. The handle 34 also comprises a guide piston 60 extending the arm 58, and adapted to be received in a cylinder 62 arranged in the wall 52, so as to guide the arm 58 as it moves along a vertical axis in the embodiment shown, so that the roller bearings 44 remain opposite the cam surfaces 54.

Figure 3:
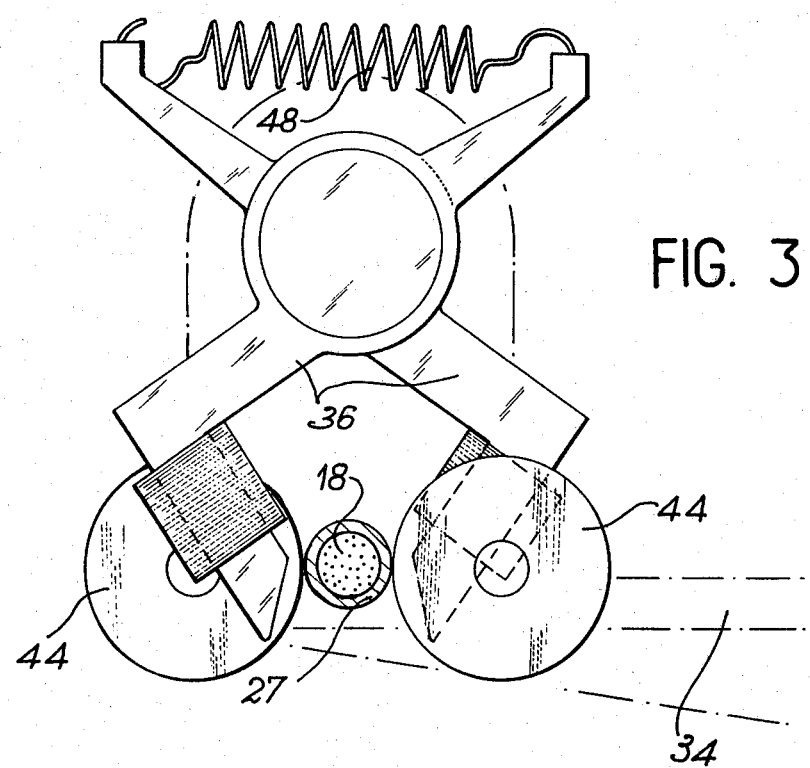
FIGS. 3 and 4 shows another alternative embodiment of the clamp, during assembly and after assembly, respectively.
Figure 4:
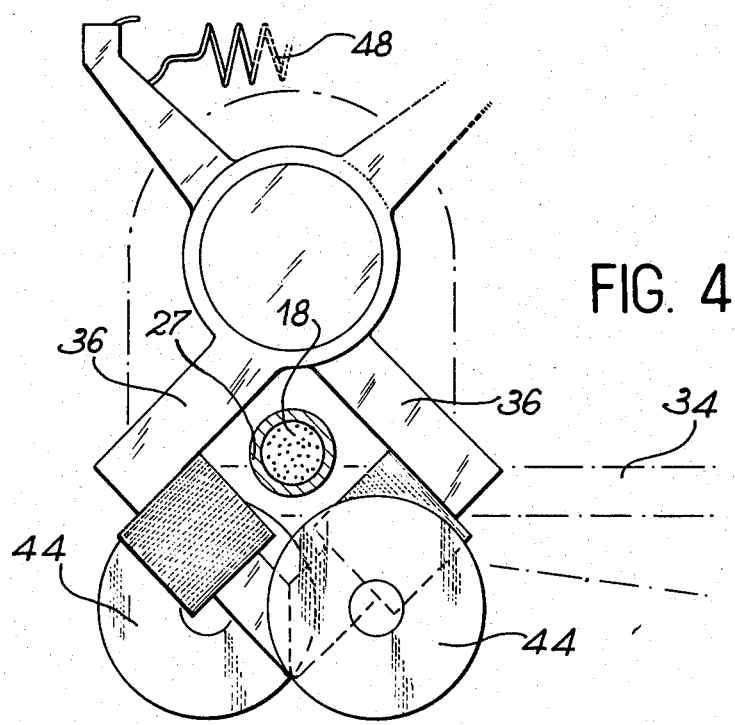

In another alternative embodiment of the invention shown in FIGS. 3 and 4, the roller bearings 44 are mounted directly on the jaws 36 so as to come into contact with the outer surface of the sheath 27 before the ends of the jaws. A spring 48 also urges the clamp into the closed position. Mounting and demounting of the clamp are effected as in the embodiment shown in FIG. 2, by displacing the clamp along an axis perpendicular to the plane of the spiral 18 and passing through the axis thereof. The clamp is shown during mounting or demounting in FIG. 3, whilst the roller bearings 44 are in the operational position in FIG. 4 with the ends of the jaws 36 in contact with each other.

It will be noted that the roller bearings are offset relative to one another so that they can be overlapped.

In the two alternative embodiments described above with reference to FIGS. 2, 3 and 4, the cooperation of the roller bearings 44 with the cam surfaces 54 or with the cam surfaces defined by the outer surface of the sheath 27 means that the clamp can be mounted or demounted by remote control, using a manipulator, for example, without damaging the ends of the jaws 36 of the clamp.

Moreover, as shown by dash-dot lines in FIG. 2, a plurality of clamps 26 may be mounted on the same spiral 18, for example by means of cam surfaces formed on at least one second member 50' identical to the member 50.

Furthermore, the form and orientation of the spiral 18 may be adapted as a function of the intended use, so as to enable the clamps 26 to be displaced relative to the spiral 18.

Thus, the spiral 18 may be located in a horizontal plane and inside the cell may be in the form of an arc of a circle, as shown in FIG. 1. With an arrangement of this kind it is possible, for example, to supply electricity to a motor controlling the rotation of an arm or the operation of a door, these latter carrying the clamp or clamps 26 directly.

The spiral 18, again arranged in a horizontal plane, may also comprise, inside the cell, a rectilinear portion along which the clamp 26 can move, in which case the clamp is associated, for example, with a carriage capable of travelling on rails inside the enclosure. When there is considerable travel of the carriage, it may comprise a certain number of clamps of the same type as the clamp 26, whilst the spiral 18 is uniformly held by supports and mechanisms controlling the opening of the clamps automatically when they come opposite these supports.

In another embodiment (not shown) the spiral is rectangular and is arranged in a substantially vertical plane, thus enabling the clamp 26 to be associated, for example, with a drop-shut door, whilst the electric motor controlling the operation of the door is supplied by means of an apparatus according to the invention.

Obviously, a large number of other applications are possible and the form and orientation of the spiral 18 can be modified as a function of the direction of translational and/or rotary movement of the apparatus associated with the clamp or clamps 26, the operation of said apparatus being controlled by means of an electrical system supplied with electrical energy by the apparatus according to the invention.

Figure 5:
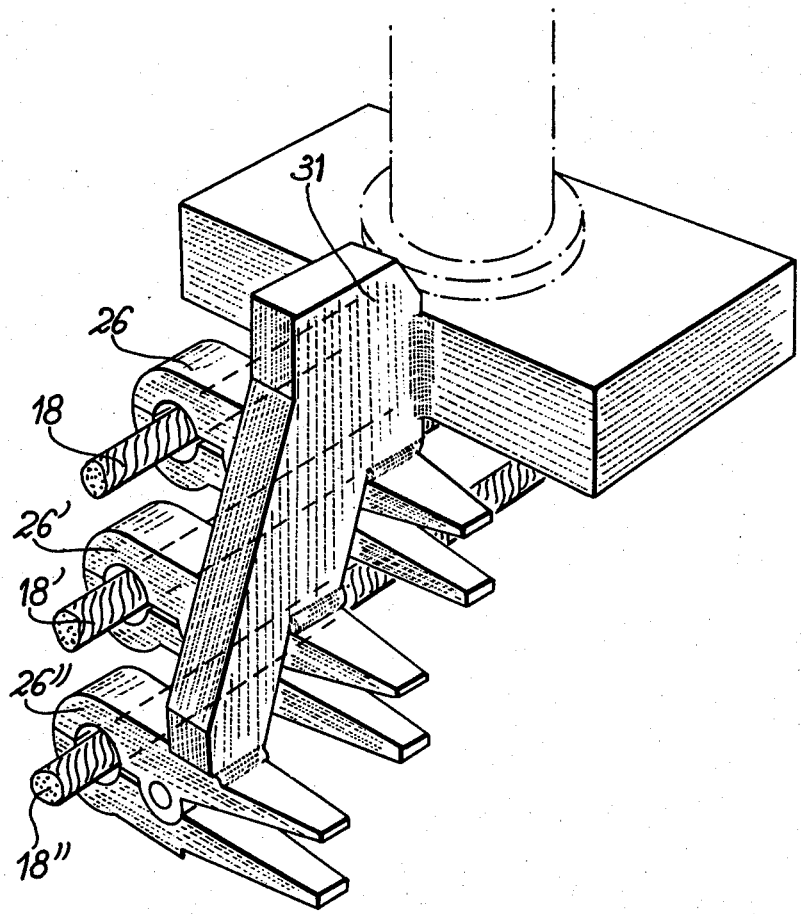
FIG. 5 is a perspective view showing an application of the apparatus according to the invention to the transmission of a three-phase current.

Finally, in another embodiment which is shown in FIG. 5, the apparatus according to the invention is used to transmit a three-phase electric current intended for supplying a three-phase apparatus. In this case, the transformers 12 and 14 are three-phase transformers, which means that the apparatus comprises three spirals 18, 18' and 18" which are preferably of the same shape and parallel and arranged at the same spacing from one another. When the apparatus to be supplied is inside a cell, these spirals pass through the wall 10 in the same way as the single spiral in the embodiment described hereinbefore. These spirals receive one or more clamps 26, 26', 26" the jaws of which define three spaces each intended to receive one of the spirals. The clamps 26, 26' and 26" are fixed by a common support 31 to an apparatus controlled by a three-phase current, such as a carriage (not shown).

According to the invention, the spiral 18 and the clamp 26 which is fixed to this portion therefore perform the same function as a power point in the known apparatus. Moreover, no electric current is set up when the spiral 18 is touched, which means that there is no risk of accidents. Moreover, the opening and closing of the clamp 26 do not cause any electric contact to be broken and made, and therefore no electric arcs can be formed. This means that the apparatus can be used in an ignitable medium or in mines. In fact, closing of the clamp is accompanied only by the closing of a magnetic flux in the core located inside the clamp. In addition, manipulation by remote control is much easier with the apparatus according to the invention than with conventional power points. Finally, all its parts subject to wear can easily be replaced.

The apparatus described above with reference to FIGS. 1 to 5 operates as follows.

In order to transmit to the inside of the cell bounded by the wall 10 the electrical power required for operating one or more apparatus supplied by the wires 40 connected to the terminals 38 of the secondary winding housed in the clamp 26, the wires 22 are connected to a current source (not shown) supplying the primary winding of the transformer 12. Under the effect of the supply current and by means of the transformers 12 and 14, electric current is established in the circuit comprising the apparatus connected to the wires 40 and the secondary winding of the transformer 14. The various apparatus arranged behind the wall 10 are thus made live. As a guide, the yield of an apparatus of this kind may reach about 0.5 when the spiral 18 is not excessively long and when the clearance between this spiral and the cores of the transformers 12 and 14 is limited. Thus, a power of about 1 KW can be transmitted to an apparatus located inside the cell bounded by the partition 10.

It will be noted that the apparatus according to the invention provides a double galvanic insulation between the current source connected to the terminals 20 and the apparatus which is to be supplied, connected to the terminals 38.

Just as the apparatus according to the invention can be used to supply one or more apparatus located inside the enclosure, it can also be used for transmitting through the wall 10, in either direction, coded commands and information. The transmission of commands and information is effected by means of modulated current, in the form of discrete frequencies or frequency variations superimposed on the supply current. The coded information may, for example, be the results of measurements, or else control commands or signal information. The frequency transmitted may be up to about 10 khz and the transmission band of the apparatus according to the invention is very wide. Separation of the coded information and the supply current may then be effected in known manner using filters or synchronous detectors before the coded information is transmitted to direct reading instruments or recorders.

According to the invention, it should be noted that only the spiral 18, when it is welded to the wall as shown in FIG. 2, and the sheath 27 when the spiral is received in a sheath welded to the wall, as shown in FIG. 1, are not removable. All the other parts of the apparatus, particularly the parts located inside the cell, can thus be changed without the need for any particular dismantling when they are worn or damaged, for example if there is a particularly corrosive atmosphere inside the enclosure. The apparatus according to the invention is therefore particularly safe and reliable and for this reason is also distinguished from known apparatus used for transmitting electrical signals.

It will be appreciated that the invention is not limited to the embodiments described by way of examples, but covers all variants. Thus, the apparatus according to the invention can be used whenever a supply of current is required, to prevent all risks of accidents or explosions. Moreover, it has already been mentioned that the form and orientation of the spiral can be modified as a function of the intended use. Similarly, the clamp 26 may be replaced by another removable member and its shape, particularly the shape of the handle 34 and jaws 36, may be modified, especially when this clamp has to be manipulated by remote control. Finally, the apparatus according to the invention can be used whenever electrical signals have to be transmitted, whatever the nature of the products being manipulated near the apparatus and the nature of the ambient medium. Thus, this medium may be a gas or a liquid, and the apparatus according to the invention can be used in a submarine or aquatic medium.

The invention is not limited to the embodiments described and represented hereinbefore and various modifications can be made thereto without passing beyond the scope of the invention.

What is claimed is:

1. Apparatus for electrical transmission, comprising a mains transformer and at least one distribution transformer, these transformers having a common winding consisting of at least one spiral which defines the secondary winding of the mains transformer and the primary winding of the distribution transformer, the secondary winding of the distribution transformer being mounted in a clamping means which comprises roller bearings capable of rolling on cam surfaces suitable for controlling the opening and closing of the clamp when the latter moves in a specified direction.

2. An apparatus according to claim 1, wherein the removable member is a clamp comprising a handle capable of being gripped by an apparatus for remote-controlled manipulation.

3. An apparatus according to claim 1, wherein the roller bearings are mounted at the ends of the jaws of the removable clamp, whilst the cam surfaces are formed by the outer surfaces of the spiral or of a sheath surrounding the spiral.

4. An apparatus according to claim 1, wherein the roller bearings are mounted on travelling blocks integral with the jaws of the removable clamp, the cam surfaces being formed on a detachable member.

5. An apparatus according to claim 1, wherein the removable member is associated with a member movable in translation in a direction parallel to the axis of the spiral and/or movable in rotation about this axis.

6. An apparatus for transmitting three-phase electric currents according to claim 3, comprising three clamps for transmitting the three phases of the electric currents.

7. An apparatus for electrical transmission through a wall according to claim 1, wherein the mains transformer is located on a first side of the wall, the distribution transformer is located on the other side of the wall and the spiral common to these transformers passes through the wall.

8. An apparatus according to claim 7, wherein the spiral is fixed to the wall in leaktight manner at the points where it passes through.

9. An apparatus according to claim 7, wherein the part of the spiral located on the other side of the wall is accommodated in a sheath fixed to the wall in leaktight manner.

10. An apparatus for electrical transmission through a wall according to claim 1, wherein the mains transformer is located on a first side of the wall and the distribution transformer is located on the other side of the wall and a tubular excrescence of said wall connected to the latter at both ends so that the inside of said excrescence communicates with the first side of the wall, whilst the spiral common to the transformers is located on the first side of the wall and inside the tubular excrescence of the wall.

* * * * *